United States Patent
Tio et al.

(10) Patent No.: US 9,048,776 B2
(45) Date of Patent: Jun. 2, 2015

(54) MODULAR MOTOR DRIVE CONFIGURATION SYSTEM AND METHOD

(71) Applicant: ROCKWELL AUTOMATION ASIA PACIFIC BUSINESS CENTER PTE. LTD., Singapore (SG)

(72) Inventors: Donald Yuen Leong Tio, Singapore (SG); Jimmy See Yong Koh, Singapore (SG); Scott Miles, Belgium, WI (US)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 90 days.

(21) Appl. No.: 13/727,209

(22) Filed: Dec. 26, 2012

(65) Prior Publication Data

US 2014/0084837 A1 Mar. 27, 2014

(51) Int. Cl.
*H02P 27/04* (2006.01)
*H05K 7/14* (2006.01)

(52) U.S. Cl.
CPC .............. *H02P 27/04* (2013.01); *H05K 7/1432* (2013.01)

(58) Field of Classification Search
CPC ........................................................ H02P 27/04
USPC ........................................... 318/519, 494, 34
See application file for complete search history.

(56) References Cited

U.S. PATENT DOCUMENTS

| | | | |
|---|---|---|---|
| 5,136,222 A * | 8/1992 | Yamamoto et al. | 318/568.2 |
| 7,597,564 B2 * | 10/2009 | Matthias et al. | 439/108 |
| 8,072,174 B2 * | 12/2011 | Campbell et al. | 318/600 |
| 8,100,205 B2 * | 1/2012 | Gettings et al. | 180/9.1 |

FOREIGN PATENT DOCUMENTS

FR  2925256 A1  6/2009
WO  2005101936 A1  10/2005

OTHER PUBLICATIONS

SG Application No. 2012072195 Office Action dated Jul. 10, 2014.
Sinamics G120 Control Units CU240S Operating Instructions; Siemens; Edition Jun. 2007; pp. 1-240.

* cited by examiner

*Primary Examiner* — David S Luo
(74) *Attorney, Agent, or Firm* — Fletcher Yoder, P.C.

(57) ABSTRACT

A motor drive system includes a power sub-assembly that comprises power electronic components and driver circuitry for controlling gate drive signals to the power electronic components. A control sub-assembly is removably mounted to the power sub-assembly and comprises control circuitry for implementing a motor control routine for control of an electric motor. In operation, all control signals originate in the control-subassembly, and are transmitted via mating connectors to the power sub-assembly for driving the motor.

18 Claims, 8 Drawing Sheets

MODULAR MOTOR DRIVE CONFIGURATION SYSTEM AND METHOD

BACKGROUND

The present invention relates generally to drive systems for powering electric motors, and more particularly to a modular drive system designed and adapted for controlling motors of various sizes and ratings.

A myriad of applications exist in industry for electric motors of various types. In many applications, induction motors are driven to rotate loads, such as pumps, fans, conveyors, to mention only a few. Other types of motors may similarly be driven. A load may call for uniform speed and torque throughout its life, although many applications require much more flexible control. That is, a motor may need to be driven at different speeds and with different torques at different stages in its operation. To accommodate such needs, variable speed motor drives have been developed that allow for output waveforms of varying and controllable frequency, capable of correspondingly varying the speeds of driven motors. Similarly, equipment has been developed for soft starting motors, starting and stopping motors in controlled manners, and so forth. Such motor drives are now ubiquitous throughout industrial, commercial, shipping, material handling, and other applications.

In general, motor drives are designed to provide good service life in a range of conditions and with a range of loads. The drives may be designed around a single package that can be programmed and wired to receive input power as well as to output conditioned power to the electric motor. Such packaged products typically include power conditioning circuitry that receives alternating current (AC) input, and converts the AC input to a DC form, before reconverting the DC power to controlled frequency AC output. Various operator interfaces and programming platforms may also be provided, as well as networking capabilities.

One particular challenge that arises in such products is the design for various motor sizes, for facilitating programming, for sharing programming and control parameters, and so forth. Most such products have been designed to power specific sizes of motors (typically rated by the power output or frame size), and the user must select and program the appropriate product for the particular motor to be powered. All of the circuitry used to control power electronic devices within the drives has typically been included in the single package. Programming has been done either manually or by an interface with a configuration computer or network connected to the unitary package. This product paradigm, however, suffers from drawbacks including limitations of installation and configuration of the drives, relatively inefficient use of control platforms between drives, in accessibility of the programming once the drive is commissioned, or, conversely, risks of access to the drives from exterior sources due to resident network connections.

There is a need, therefore, for improved techniques for driving electric motors that can respond to such drawbacks.

BRIEF DESCRIPTION

The present invention provides a motor drive system and method designed to respond to these needs. In accordance with aspects of the invention, motor drive system comprises a power subassembly including power electronic switches controllable to provide controlled frequency AC power to an electric motor, and driver circuitry configured to apply gate drive signals to the power electronic switches. The system further comprises a control subassembly separable from the power subassembly but physically configured to be attached to the power subassembly and to make electrical connections with the power subassembly when attached, the control subassembly including a user interface and control circuitry that, in operation, applies control signals to the drive circuitry for controlling the power electronic switches.

In accordance with other aspects of the invention, a motor drive system comprises a control subassembly separable from but physically configured to be attached to a power subassembly and to make electrical connections with the power subassembly when attached. The control subassembly includes a user interface and control circuitry that, in operation, applies control signals to drive circuitry within the power subassembly for controlling power electronic switches to provide controlled frequency AC power to an electric motor.

The invention also provides a motor drive method that comprises connecting a power subassembly to an electric motor, the power subassembly including power electronic switches controllable to provide controlled frequency AC power to an electric motor, and driver circuitry configured to apply gate drive signals to the power electronic switches. A programmed control subassembly is then attached to the power subassembly to make electrical connections with the power subassembly, the control subassembly including a user interface and control circuitry that, in operation, applies control signals to the drive circuitry for controlling the power electronic switches.

DRAWINGS

These and other features, aspects, and advantages of the present invention will become better understood when the following detailed description is read with reference to the accompanying drawings in which like characters represent like parts throughout the drawings, wherein.

Figure 7:
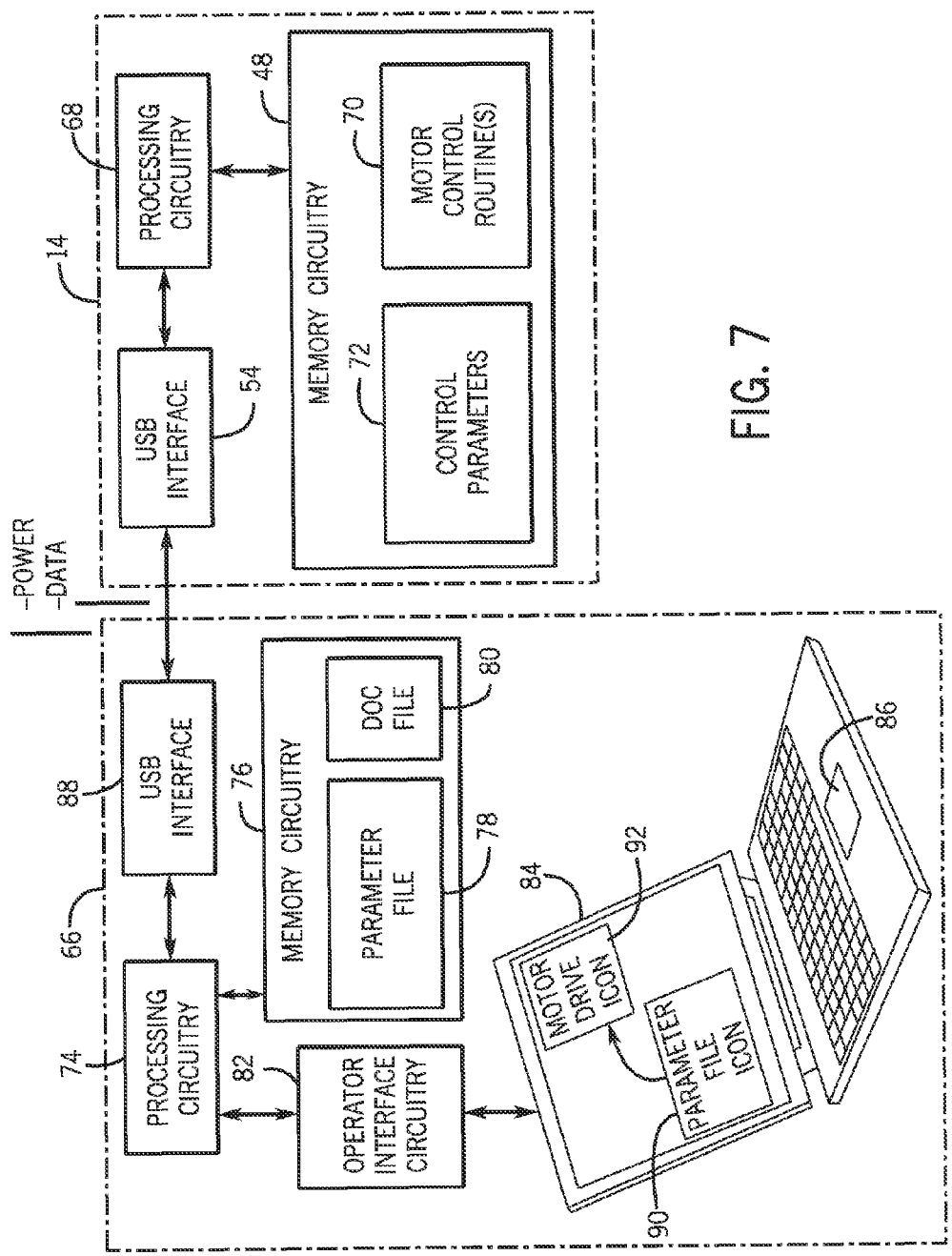
Figure 8:
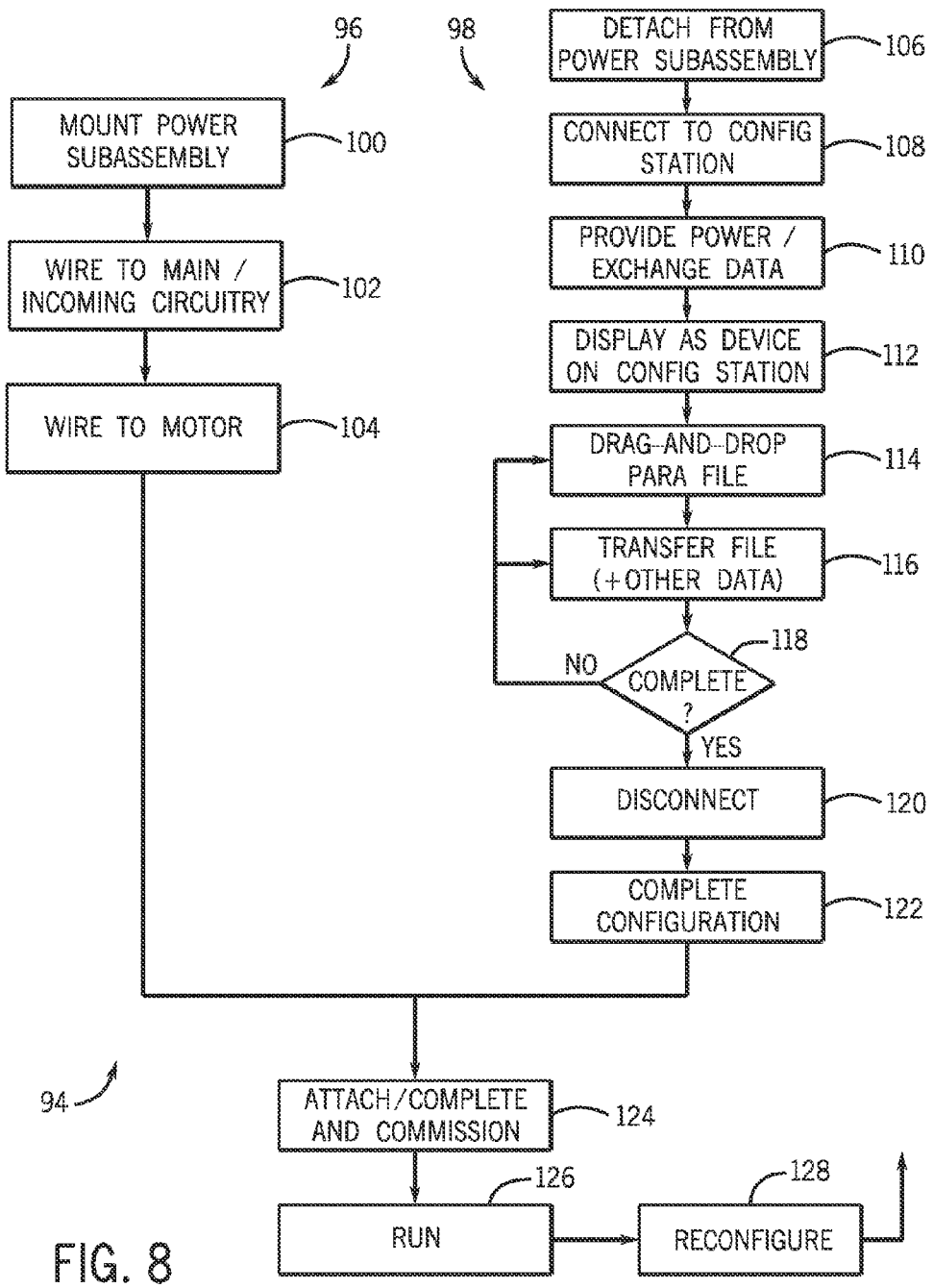

FIG. 6, and FIGS. 6A-6F, illustrate a presently contemplated technique for removing a control sub-assembly and connecting it to a configuration station for programming;

FIG. 7 is a diagrammatical illustration of certain functional circuits and files contained in a configuration station and in a control sub-assembly for ease of drive configuration; and FIG. 8 is a flow chart illustrating exemplary logic for preparation of a power sub-assembly and a control sub-assembly during configuration and commissioning of a drive in accordance with the present techniques.

DETAILED DESCRIPTION

Figure 1:
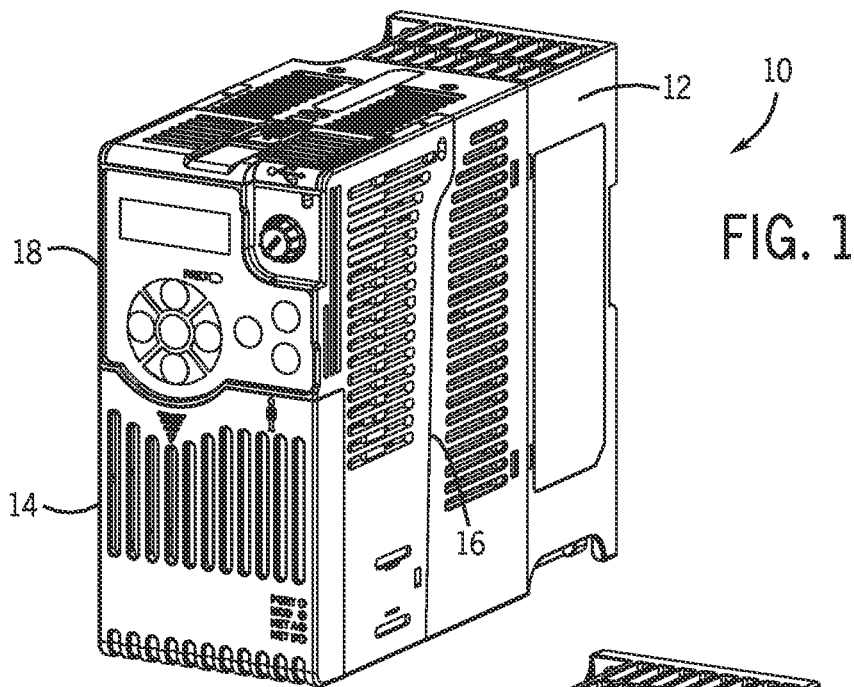
FIG. 1 is a perspective view of an exemplary motor drive system in accordance with aspects of the present techniques.

FIG. 1 illustrates an exemplary motor drive system 10 designed to power an electric motor such as an induction motor. The motor drive system essentially consists of a power sub-assembly 12 and a control sub-assembly 14 which is designed to be secured to and attached to the power sub-assembly during operation. A mechanical interface 16 allows for mating of the sub-assemblies and the control sub-assembly may be held on to the power sub-assembly in various manners, such as via snaps, fasteners, and the like. However, in a presently contemplated embodiment, the control sub-assembly and the power sub-assembly are physically configured to allow the control sub-assembly to be secured to the power sub-assembly via interfacing surfaces, such that the control sub-assembly may be attached and detached form the power sub-assembly by hand and without the use of tools. This ability to toollessly attach and detach the control sub-assembly greatly facilitates programming, reprogramming, commissioning and servicing of the system. An operator interface 18 is shown on a front face of the control sub-assembly and may allow for certain user interactions with the drive, such as to view configuration parameters, alter configuration parameters, view logs, history, error and other codes, view certain operational parameters (e.g., currents, voltages, speeds) and so forth. In a present embodiment, the operator interface comprises an LCD module that supports multiple languages, and is able to display parameter codes followed by dynamic descriptions.

Figure 2:
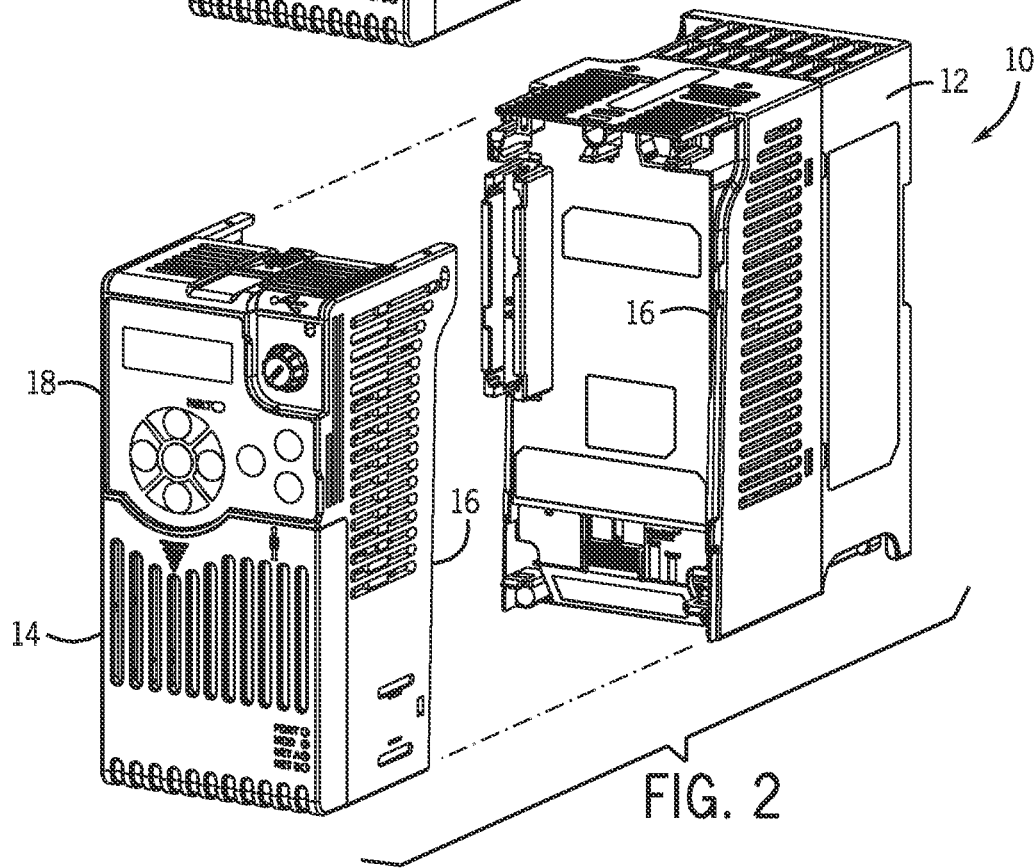
FIG. 2 is a similar perspective view of the system of FIG. 1 with a control sub-assembly removed from a power sub-assembly.

As shown in FIG. 2, the control sub-assembly is removable from the power sub-assembly 12, such as for configuration (programming), servicing, and so forth. As discussed more fully below, the control sub-assembly may be removed from the power sub-assembly without disconnecting the power sub-assembly from either the power supply (e.g., upstream power circuitry) or from the electric motor once places in service.

Figure 3:
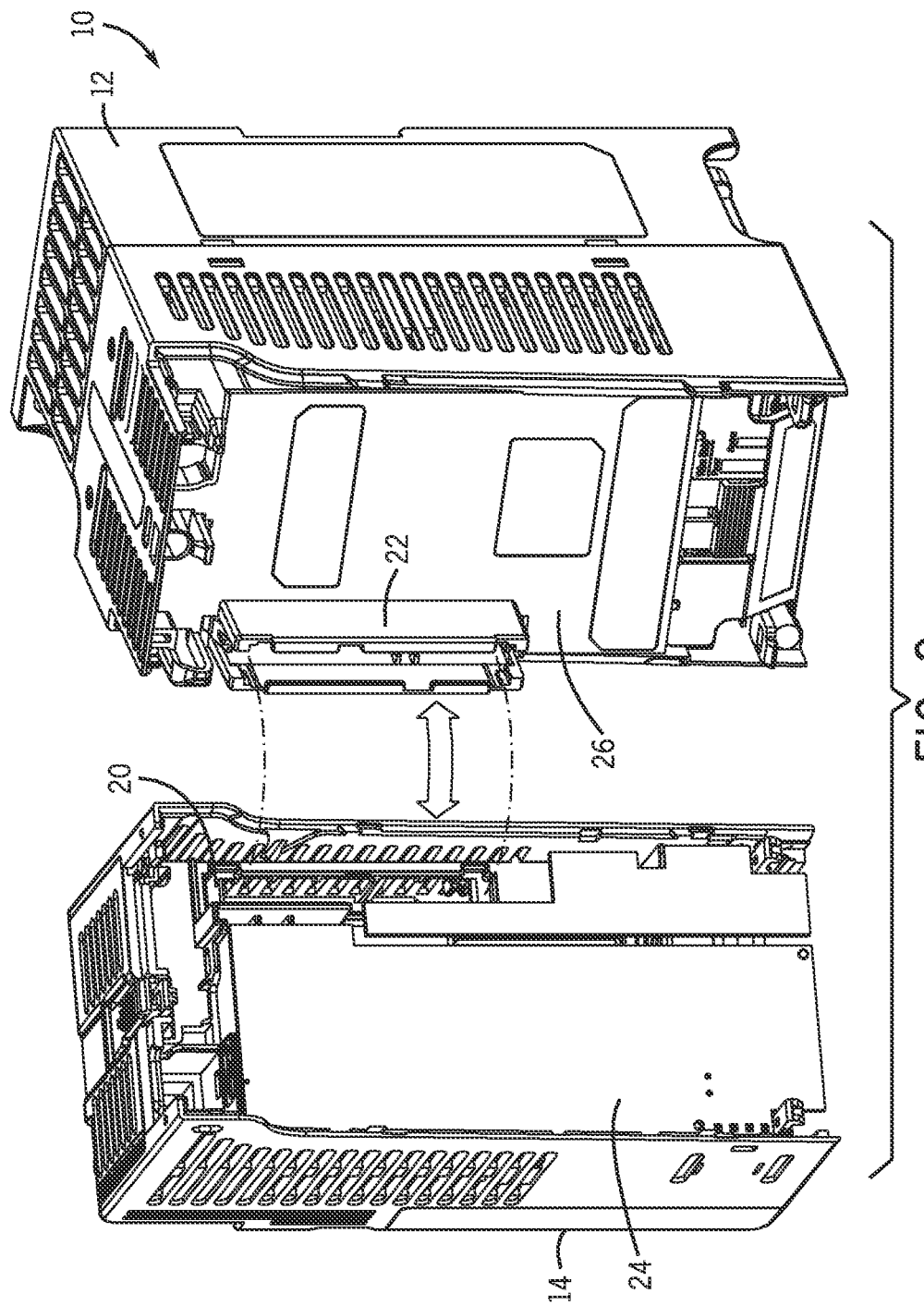
FIG. 3 is a perspective view of the control sub-assembly and power sub-assembly illustrating internal plug-in connectors for mating the two and for the exchange of signals between the two.

In the presently contemplated embodiment, multi-conductor connectors mate when the control sub-assembly is mounted on or attached to the power sub-assembly. FIG. 3 illustrates the control sub-assembly 14 removed from the power sub-assembly, and shows the multi-conductor connectors 20 and 22 that interface with one another when the two sub-assemblies are brought together to transfer power and data between the control sub-assembly and the power sub-assembly. That is, in the presently contemplated embodiment, the control sub-assembly 14 does not contain the means for supplying its own power (e.g., a battery), but receives power from the power sub-assembly 12 when the two are connected. Moreover, the control sub-assembly 14 performs all computations, implements all control routines, and generates all control signals that are applied to the power circuitry within the power sub-assembly (as described more fully below) via the multi-conductor connectors. The connectors 20 and 22 are provided on sides of the control sub-assembly and power sub-assembly that face one another and are exposed only when the sub-assemblies are separated, as indicated by reference numerals 24 and 26. That is, the facing sides are not accessible when the two sub-assemblies are mated.

Figure 4:
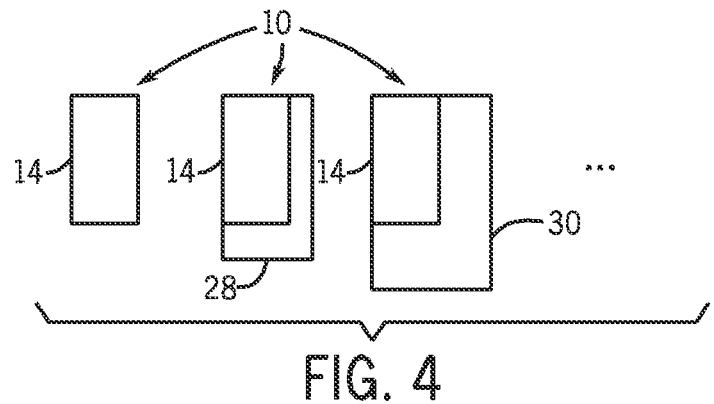
FIG. 4 is an exemplary illustration of how the same control sub-assembly may be used with different power sub-assemblies having different ratings.

Although FIGS. 1-3 illustrate a control sub-assembly that is generally co-extensive with the power sub-assembly, it is presently contemplated that the same control sub-assembly may serve to accommodate various power sub-assemblies that increase in both size and rating. FIG. 4 illustrates three such arrangements. In the first, the control sub-assembly 14 is shown over a power sub-assembly which is located behind the control sub-assembly, the two sub-assemblies being generally co-extensive with one another. As indicated by reference numerals 28 and 30, however, power sub-assemblies of larger sizes and ratings may be coupled to the same control sub-assembly 14. The power sub-assemblies mate and interface in similar manners, and the circuitry within the control sub-assembly is designed to allow for motors of various sizes to be driven without altering the hardware or circuitry within the control sub-assembly. Such larger sizes are accommodated only by programming changes within the control sub-assembly. In presently contemplated embodiments, for example, power sub-sections having ratings of 0.4 to 22 kw/0.5 to 30 hp at 400/480V, with global voltage classes of 110V, 200V, 400V and 600V may be accommodated by the same control sub-assembly. However, other sizes and weightings may, of course, be envisaged.

In accordance with presently contemplated embodiments, the power sub-assembly comprises power electronic devices (e.g., switches) that regulate the conversion power from a power source to controlled frequency AC output for driving the electric motor. The control sub-assembly, on the other hand, comprises processing capabilities, motor control routines, parameters utilized by the routines for motor control, operator interface circuitry, and so forth to provide control signals for the power electronics of the power sub-assembly. The control signals are applied to the circuitry within the power sub-assembly based on the motor control routines and any further processing in the power sub-assembly converts these control signals to timing signals for driving the gates of power electronic switches within the power sub-assembly.

Figure 5:
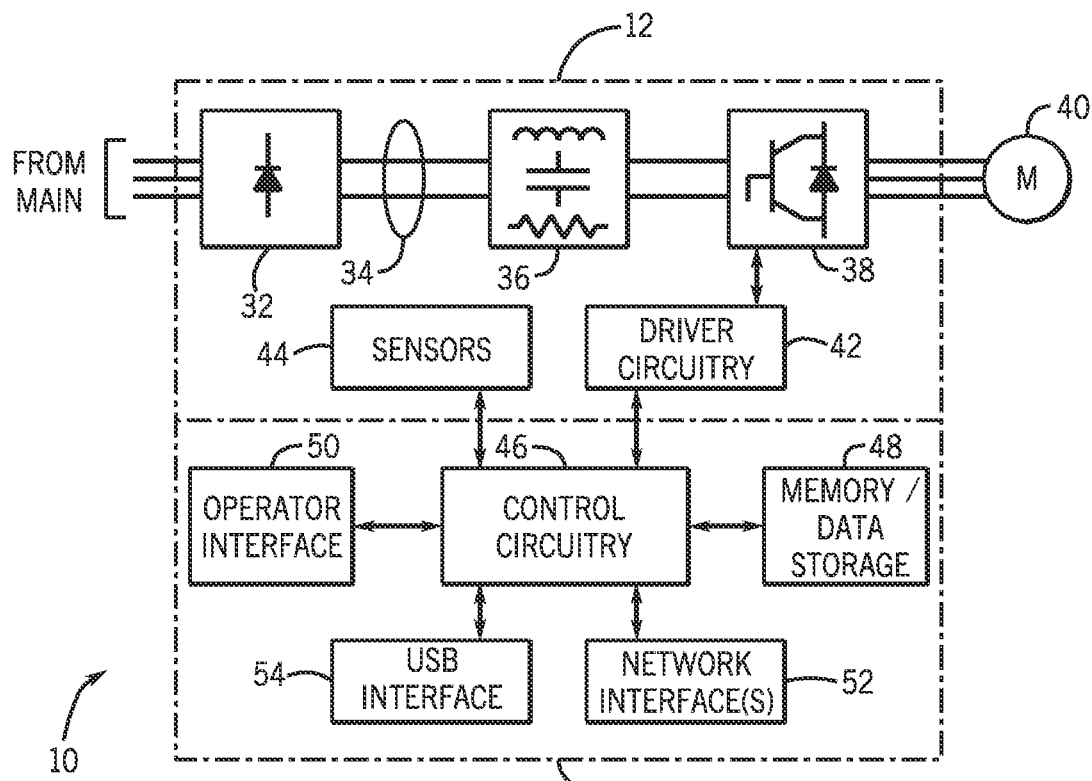
FIG. 5 is a diagrammatical representation of certain of the functional circuitry contained in the power sub-assembly and control sub-assembly.

This general topology is illustrated diagrammatically in FIG. 5. As shown in FIG. 5, the power sub-assembly 12 is designed to receive power from a power grid or main, or more generally from an input power supply. The power will typically be applied by conductors or busses, and the drive system may be, where desired, mounted near or remote from an electric motor that is driven by the system in operation. In certain embodiments and installations, the motor drive system may be rigidly mounted in a cabinet, on rails, or in any suitable manner. The incoming power may conform to various standards, depending upon the country or region in which the system is utilized, but will typically provide single or three-phase input power that is applied to a rectifier circuit 32. The rectifier circuitry may be passive or active, and where desired may allow for regenerated power to be applied back to the power source (e.g., during deceleration or braking of the load). The rectifier circuit 32 produces DC output that is applied to a DC bus 34. Various conditioning and support circuitry, illustrated generally by reference numeral 36 may be connected to the DC bus. As will be appreciated by those skilled in the art, such circuitry may include inductors, capacitors, resistors, and so forth. In general, inductors and capacitors may be utilized to store energy in the DC bus, and to smooth variations or ripple in the DC power, as well as to supply energy during certain periods of operation. Resistors may be provided for braking or dissipating energy, and so forth. DC power from the DC bus is applied to an inverter circuit 38, or more generally to a power converter circuit. The inverter circuit will typically include pairs or power electronic switches, such as insulated gate bipolar transistors (IGBTs) associated with diodes. These power electronic switches are driven to allow power to be drawn from the DC bus to form a synthetic sinusoidal output of a controlled frequency. The output power is then applied to an electric motor 40. While in many applications the drive system is configured to drive single or multi-phase AC motors, it should be noted that the drive system may be adapted for driving different motor types, such as permanent magnet motors.

In the illustration of FIG. 5, the power sub-assembly 12 also includes driver circuitry 42. The driver circuitry 42 acts based upon control signals received from the control sub-assembly to generate gate drive signals that are applied to the power electronic switches of the inverter circuitry 38. Where a switched rectifier is provided, such driver circuitry, or a separate circuit may similarly apply signals to the rectifier. The driver circuitry 42 may base the timing of the gate drive signals upon any desired algorithm, such as utilizing triangular carrier waves and other techniques generally known in the art. Finally, the power sub-assembly 12 may include various sensors, indicated collectively by the reference numeral 44, that detect feedback parameters, such as voltages, currents, position (electric motor) and so forth during operation. Signals to and from the driver circuitry 42 and from the sensors 44 are provided to the control sub-assembly via the multi-connectors discussed above.

The control sub-assembly 14 as illustrated in FIG. 5 comprises control circuitry 46 designed to implement one or more motor control routines based upon programmed parameters stored within the control sub-assembly. The control circuitry 46 may comprise any suitable processor or multiple processors, including micro-processors, field programmable gate arrays, dedicated application specific integrated circuits, and so forth. Memory circuitry, indicated generally by reference numeral 48 is associated with the control circuitry and allows for storage of motor control routines, parameters referred to by the routines, as well as a vast array of other information that may be useful for controlling and monitoring the motor. An operator interface 50 is further coupled to the control circuitry to allow for access to certain parameters, for alteration of programming and parameters, and so forth, such as via the operator interface illustrated in FIG. 1. One or more network interfaces 52 may be provided for similarly accessing certain information from the drive system. Such interfaces may include an EtherNet interface, various industrial data exchange protocol interfaces (e.g., DeviceNet, ControlNet, Profibus, Modbus, etc.). EtherNet capability allows the drive system to be integrated into an EtherNet IP infrastructure, and the use of a dual port EtherNet card may permit connectivity options such as device level ring networking. Finally, a universal serial bus (USB) interface is provided in the illustrated embodiment. While one or more of these interfaces may be accessible from outside the drive system when assembled, in a presently contemplated embodiment the network interfaces 52 are accessible when the control sub-assembly is mounted on the power sub-assembly, while the USB interface, which allows for file transfer and configuration of the drive system, is not accessible unless the control sub-assembly is removed from the power sub-assembly. Where desired, the drive system may be protected by the use of passwords or other security devices.

Figure 6:
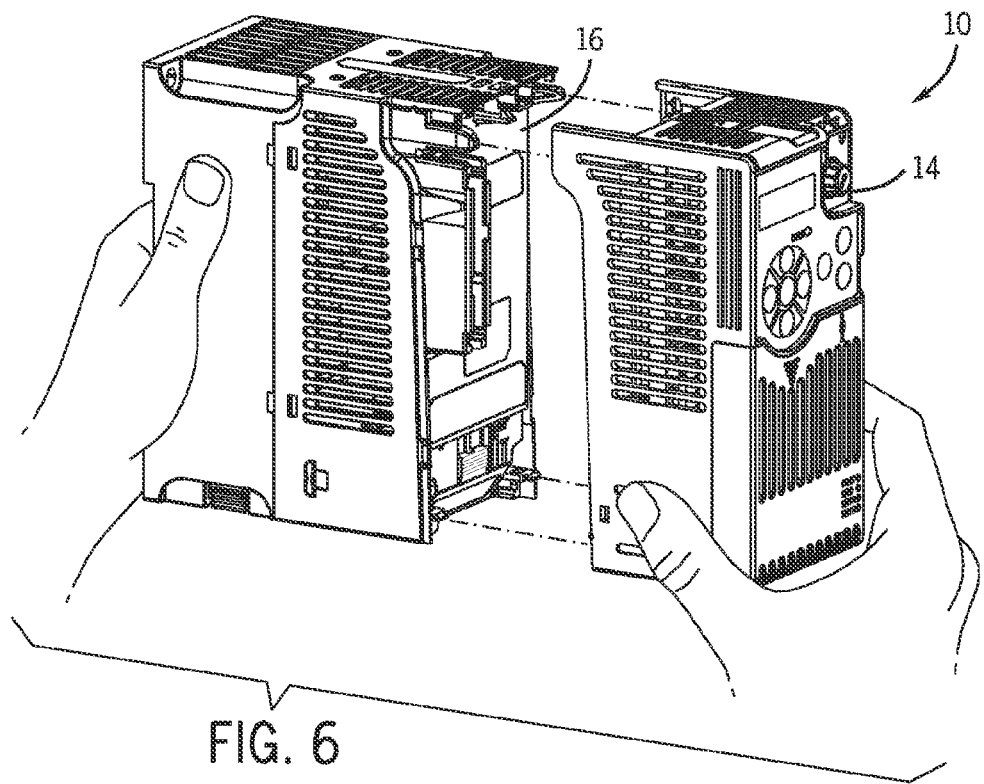
Figure 6A:
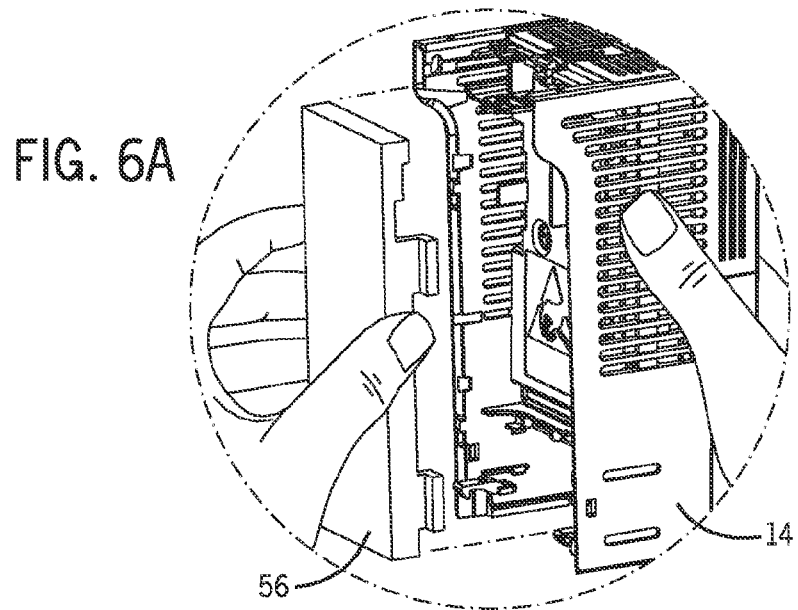
Figure 6B:
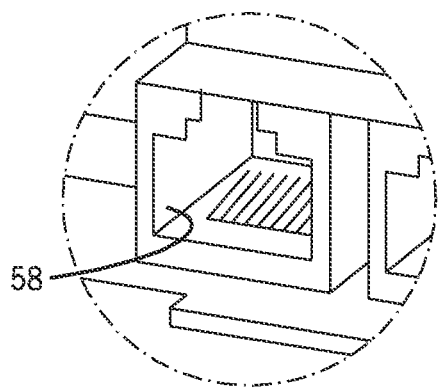
Figure 6C:
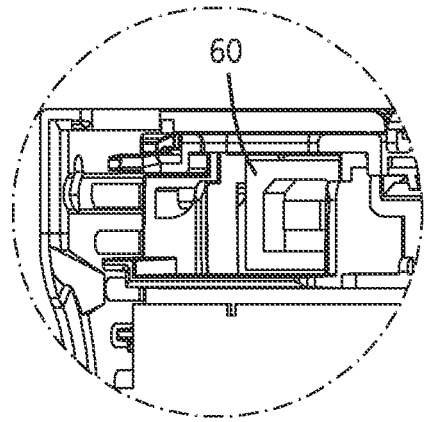

FIG. 6, along with FIGS. 6A-6F, illustrate a presently contemplated technique for coupling the control sub-assembly to a configuration station for file transfer and configuration. As shown in FIG. 6, the control sub-assembly 14 may be removed from the power sub-assembly by withdrawing it from the interface 16. As shown in FIG. 6A, then, a cover or internal portion of the control sub-assembly may be removed, as indicated by reference numeral 56. Within the control sub-assembly, various connector interfaces may be accessible, such as an EtherNet receptacle 58 (see, FIG. 6B) and a USB receptacle 60 (see, FIG. 6C).

Figure 6D:
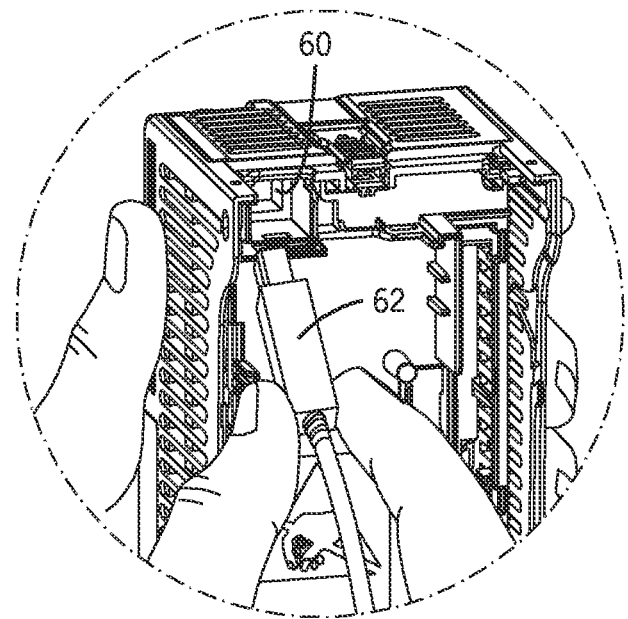
Figure 6E:
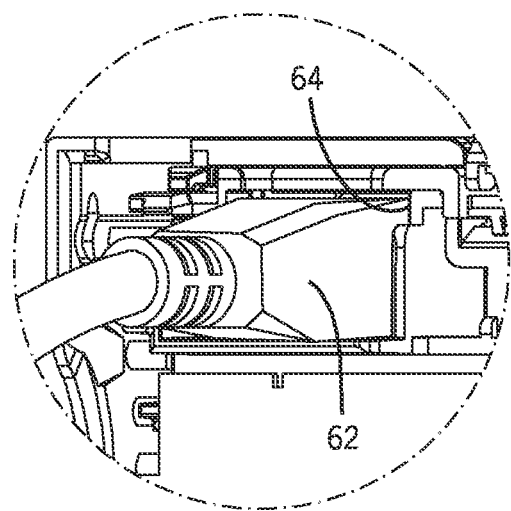
Figure 6F:
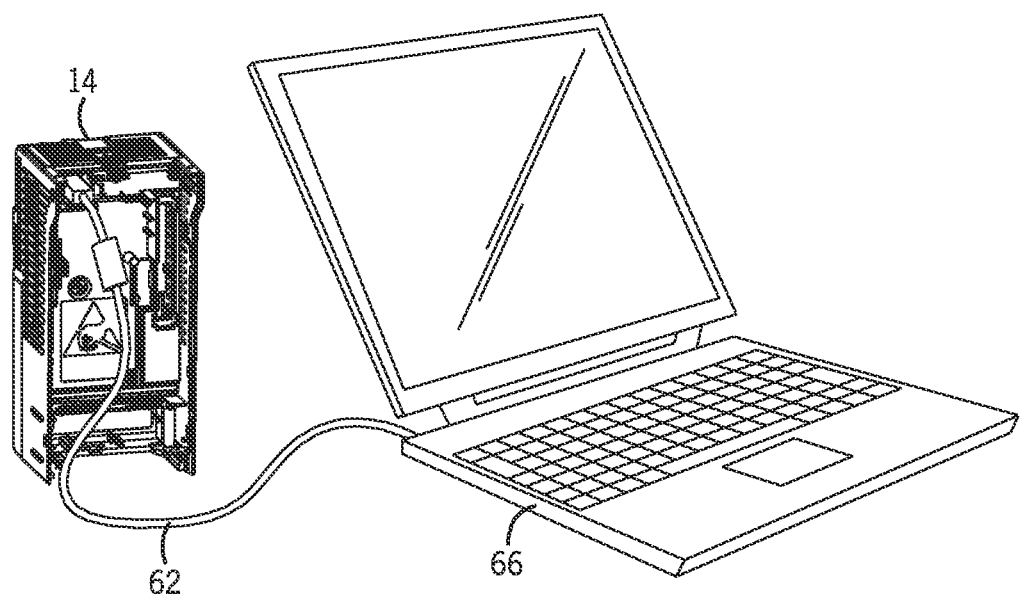

For transfer of data to the control sub-assembly, including the transfer of files, configuration parameters, control parameters, as well as alteration of these, a USB cable 62 may be coupled to the USB receptacle 60 as indicated in FIG. 6D. The completed connection 64 effectively tethers the control sub-assembly via the USB cable 62 as indicated in FIG. 6E. The USB cable may be coupled to a configuration station, such as a general purpose computer as indicated by reference numeral 66 in FIG. 6F.

In accordance with aspects of the present techniques, not only may the power sub-assembly and control sub-assembly be separately mounted, connected and installed, but programming of the control sub-assembly may be facilitated after it is detached from the power sub-assembly by means of the USB connection discussed above. In particular, in a presently contemplated embodiment, the processing circuitry and interface circuitry contained within the control sub-assembly allow the control sub-assembly to identify itself in accordance with a USB mass storage device class. As such, conventional file access software running on the configuration station will recognize the control sub-assembly and an icon representative of the control sub-assembly will appear on the configuration station when the two are tethered to one another via the USB cable.

It should be noted that in presently contemplated embodiments, the control sub-assembly not only implements USB mass storage class (MSC) functionality, but is a USB composite device, which allows it to implement multiple interfaces. The system may implement the MSC functionality as a read-only file system and also a human interface device (HID) class to provide additional functionality. The MSC class interface provides access to documentation (e.g., manuals) and a computer application that the user can run to communicate with the drive system using the HID class interface. This application provides the ability upload drive and peripheral configurations, download drive and peripheral configurations, and flash update the drive system and peripheral.

Certain exemplary functional components for such functionality are illustrated generally in FIG. 7. As shown in FIG. 7, the control sub-assembly 14 comprises processing circuitry 68 which may form part of the control circuitry within the sub-assembly as discussed above. The processing circuitry 68 has access to memory circuitry 48. Such memory circuitry may store various motor control routines as indicated by reference numeral 70. In presently contemplated embodiments, these motor control routines are pre-loaded on the control sub-assembly prior to shipment to users. The motor control routines may include, for example, volts per hertz, sensorless vector control, field oriented control, permanent magnet motor support, and closed-loop feedback with an optical encoder. Moreover, control parameters 72 are stored in the memory circuitry and are used by the motor control routine during operation, to regulate application of drive signals to the power electronic devices within the power sub-assembly. As discussed below, these control parameters may be pre-loaded prior to configuration of the drive system, or one or more of the parameters may be altered and installed by virtue of the conformance of the control sub-assembly to a USB mass storage device class. The control sub-assembly further includes a USB interface 54 as discussed above that allows for the supply of data and power from the configuration station when the two are connected.

The configuration station 66 as shown in FIG. 7 includes processing circuitry 74 that has access to memory circuitry 76. The processing circuitry 74 may vary, depending upon the computer utilized, as may the memory circuitry 76. In general, all such general purpose computers will include adequate processing circuitry and memory circuitry for carrying out the file transfers required. The memory circuitry may store one or more parameter files 78, as well as documentation files as indicated by reference numeral 80. It should be noted that such documentation files may also be stored in the memory circuitry of the control sub-assembly (and accessed by connection to the configuration station). Operator interface circuitry 82 allows the processing circuitry to send and receive signals to ancillary devices, such as a display or monitor 84, and one or more input and output devices as indicated by reference numeral 86. Finally, a USB interface 88 allows for interconnection of the control sub-assembly 14 with the configuration station 66.

As noted above, the configuration sub-assembly 14 comprises a configuration (e.g., one or more drivers) which allows it to self-identify to the configuration station as a USB mass storage device. As such, once connected, the control sub-assembly will cause the operator interface 82 and display 84 to show an icon 90 representative of the motor drive. By selecting this icon, a user may access information within the control sub-assembly in accordance with data stored within memory circuitry 48. Moreover, the user may search for and identify one or more icons representative of the files stored within memory circuitry 76. In the illustrated embodiment, a parameter file icon 92 is shown corresponding to the parameter file 78. In certain embodiments, the parameter file may be received from a remote location, received from internal memory or memory devices installed within the configuration station, or may originate from any other source. Moreover, in certain embodiments the parameter file may be accessed on the configuration station and altered as desired. Ultimately, then, the parameter file may be transferred to the configuration station by a simple drag-and-drop file transfer operation as permitted by the USB mass storage device standards. While further configuration may take place, or the basic configuration may take place by access to and from remote equipment (such as via an external EtherNet connection), the use of the controlled access USB port may tend to reduce risks of unwanted or inappropriate access once the drive is programmed and commissioned.

It should be noted that a number of useful configuration and programming software packages may be used with the drive system for standard and customized configuration. For example, many parameters for common motor applications may be pre-loaded into the control sub-assembly, or programmed by the USB port as described herein, such as for driving fans, pumps, conveyors, mixers, blowers, and so forth. Software packages for facilitating such configuration are commercially available from Rockwell Automation of Milwaukee, Wis. under the commercial designation App-View™. Moreover, editing and customizing of the parameters may be facilitated by use of such software tools as CustomView™ using Connected Component Workbench™ software, also available from Rockwell Automation. Integration with programmable automation controllers may be based on profiles, such as provided in RSLogix™ 5000 software from Rockwell Automation. Such profiles allow for reduction in programming time by automatically populating important information such as parameters and tags. Such software may also allow for automatic detection of replacement of the control sub-assembly so that all configuration parameters may be downloaded, eliminating the need for manual re-configuration.

FIG. 8 illustrates exemplary logic 94 for processing the power sub-assembly and control sub-assembly during installation, configuration and commissioning. As noted above, the separate ability of the power sub-assembly and control sub-assembly allow the power sub-assembly to be separately installed, where desired, from the control sub-assembly. The power sub-assembly may thus be wired to upstream power supply circuitry and to the electric motor to be powered, while the control sub-assembly may be programmed at the same time. Because these operations often take place in quite different settings, the ability to process the two sub-assemblies separately may add efficiency and convenience to the installation process. Moreover, one or more sub-assemblies may be configured in a controlled environment while power sub-assemblies are being installed at the site of the application. Still further, in the event of replacement of a control sub-assembly, this sub-assembly may be fully configured prior to installation on the power sub-assembly simply by swapping an old control sub-assembly with a new one. Still further, the use of a single design control sub-assembly allows for control sub-assemblies to be separately purchased, stocked, and installed with control sub-assemblies being essentially interchangeable between power sub-assemblies with the exception of any settings and parameters that are unique to the size, rating and operational characteristics of the motor to be powered.

As shown in FIG. 8, processing of the power sub-assembly as indicated generally by reference numeral 96 may begin with mounting the power sub-assembly 100 in appropriate location, enclosure, and so forth. The power of sub-assembly may then be wired to the main or, more generally, to upstream or incoming circuitry as indicated by reference numeral 102, and then may be wired to the motor 104. These connections may be made and verified prior to attachment of the control sub-assembly to the power sub-assembly.

Processing and configuration of the control sub-assembly may take place in a series of steps as indicated by reference numeral 98, starting with detachment of the control sub-assembly from the power sub-assembly, if it was previously attached, as indicated at reference numeral 106. Here again, the control sub-assembly may be detached from the power sub-assembly by toollessly removing it (i.e., by hand). In practice, the two devices may be purchased and shipped separately, or may arrive in a single package but with the control sub-assembly unmounted. The control sub-assembly may then be connected to the configuration station as indicated by reference numeral 108, such as via the USB port discussed above with reference to FIG. 6. Power and data are then provided to the control sub-assembly as indicated at step 110. As noted above, the control sub-assembly may not have its own separate power source, such that input power may be required for accessing information, powering the processing circuitry, and so forth. In such cases, the USB connection between the configuration station and the control sub-assembly may provide not only data but power, at least temporarily, for operation of the control sub-assembly. As indicated at step 112, then, the control sub-assembly will appear as an icon on the configuration station by virtue of the conformance of the control sub-assembly with the standards of the USB mass storage a USB mass storage device class. Various operations may then be performed by interacting with the icon, such as enumerating certain data on the control sub-assembly, accessing certain routines, and so forth. As indicated at step 114, one of these operations may include a drag-and-drop transfer of a parameter file from the configuration station to the control sub-assembly. Once selected by the user, then, the file is transferred, along with any other data that the user may desire to transfer to the configuration sub-assembly, alter within the configuration sub-assembly and so forth. It should also be noted, however, that certain of these operations may be limited or disallowed, and access to the control sub-assembly may, where desired, be limited by passwords and other security devices.

Once the file transfer is complete, the user may determine whether all desired configuration, parameter checks and selections, and so forth have been performed as indicated at step 118, and if not, the user may continue with such operations by returning to one of the previous steps. Once the configuration is complete, the control sub-assembly may be disconnected from the configuration station as indicated at step 120. The configuration is then completed as indicated at step 122, and the control sub-assembly may be mounted on the power sub-assembly as indicated at step 124, which, again, may be performed toollessly. Step 124 may include various other sub-steps required for commissioning of the drive, including testing of various functionality, and so forth. Once commissioning is complete, the drive may be run normally as indicated at step 126. If at any time thereafter configuration is to be altered or the control sub-assembly is to be replaced, reconfiguration may be easily reformed as indicated at step 128. Such reconfiguration may include removal of the control sub-assembly from the power sub-assembly and re-accessing of the parameters as indicated above, transfer of parameters and files as indicated above, and so forth. Moreover, such reconfiguration may occur directly and manually by interacting with the operator interface on the control sub-assembly. Moreover, in certain embodiments, changes and configurations may be performed by accessing the control sub-assembly from an external network connection as discussed above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor drive system comprising:
    a power subassembly including power electronic switches controllable to provide controlled frequency AC power to an electric motor, and driver circuitry configured to apply gate drive signals to the power electronic switches; and
    a control subassembly separable from the power subassembly but physically configured to be toollessly attached to the power subassembly and to make electrical connections with the power subassembly when attached, the control subassembly including a user interface and control circuitry that, in operation, applies control signals to the drive circuitry for controlling the power electronic switches, wherein the power and control subassemblies comprise mating multi-conductor connectors that mate when the control subassembly is attached to the power subassembly to convey signals between the power and control subassemblies.

2. The system of claim 1, wherein the multi-conductor connectors are hidden between the power and control subassemblies when the control subassembly is attached to the power subassembly.

3. The system of claim 1, wherein the control subassembly is configured to be removed from the power subassembly for connection to a configuration station, and to be attached to the power subassembly following configuration.

4. The system of claim 3, wherein the control subassembly comprises a connector interface configured to be connected to the configuration station.

5. The system of claim 4, wherein the connector interface is disposed on a side of the control subassembly that faces the power subassembly when the control subassembly is attached to the power subassembly.

6. The system of claim 1, wherein the control subassembly is configured to be attached to any one of a plurality of power subsections of different size and power rating.

7. A motor drive system comprising:
    a control subassembly separable from but physically configured to be toollessly attached to a power subassembly and to make electrical connections with the power subassembly when attached, the control subassembly including a user interface and control circuitry that, in operation, applies control signals to drive circuitry within the power subassembly for controlling power electronic switches to provide controlled frequency AC power to an electric motor; and
    a multi-conductor connector that mates with a complementary connector of the power subassembly when the control subassembly is attached to the power subassembly to convey signals between the power and control subassemblies.

8. The system of claim 7, wherein the control subassembly is configured to be attached and to interface with any one of a plurality of power subsections of different size and power rating.

9. The system of claim 7, wherein the multi-conductor connector is disposed on a side of the control subassembly that faces the power subassembly when the control subassembly is attached to the power subassembly.

10. The system of claim 7, wherein the control subassembly is configured to be removed from the power subassembly for connection to a configuration station, and to be attached to the power subassembly following configuration.

11. The system of claim 10, wherein the control subassembly comprises a connector interface configured to be connected to the configuration station.

12. The system of claim 11, wherein the connector interface is disposed on a side of the control subassembly that faces the power subassembly when the control subassembly is attached to the power subassembly.

13. A motor drive method comprising:
    connecting a power subassembly to an electric motor, the power subassembly including power electronic switches controllable to provide controlled frequency AC power to an electric motor, and driver circuitry configured to apply gate drive signals to the power electronic switches; and
    toollessly attaching a programmed control subassembly to the power subassembly to make electrical connections with the power subassembly, the control subassembly including a user interface and control circuitry that, in operation, applies control signals to the drive circuitry for controlling the power electronic switches; and
    prior to attaching the programmed control subassembly to the power subassembly, configuring the control subassembly via a configuration station connected to a connector interface on a side of the control subassembly that faces the power subassembly when the control assembly is attached to the power subassembly.

14. The method of claim 13, comprising removing the control subassembly from the power subassembly, re-configuring the control subassembly via the connector interface, and re-attaching the control subassembly to the power subassembly.

15. The method of claim 13, wherein the connector interface is inaccessible when the control subassembly is attached to the power subassembly.

16. The method of claim 13, wherein the power subassembly is connected to the electric motor prior to attaching the programmed control subassembly to the power subassembly.

17. The method of claim 13, comprising selecting the power subassembly from a plurality of power subassemblies of different size and rating depending upon the size and rating of the electric motor, wherein the same control subassembly is configured to be attached to and to function with any one of the plurality of power subassemblies.

18. A motor drive system comprising:
- a power subassembly including power electronic switches controllable to provide controlled frequency AC power to an electric motor, and driver circuitry configured to apply gate drive signals to the power electronic switches;
- a control subassembly separable from the power subassembly but physically configured to be toollessly attached to the power subassembly and to make electrical connections with the power subassembly when attached, the control subassembly including a user interface and control circuitry that, in operation, applies control signals to the drive circuitry for controlling the power electronic switches, wherein the power and control subassemblies comprise mating multi-conductor connectors that mate when the control subassembly is attached to the power subassembly to convey signals between the power and control subassemblies; and
- wherein the control subassembly is configured to be removed from the power subassembly for connection to a configuration station, and to be attached to the power subassembly following configuration.

\* \* \* \* \*